United States Patent [19]

Hoff, Jr.

[11] 4,007,452
[45] Feb. 8, 1977

[54] WAFER SCALE INTEGRATION SYSTEM

[75] Inventor: Marcian E. Hoff, Jr., Sunnyvale, Calif.

[73] Assignee: Intel Corporation, Santa Clara, Calif.

[22] Filed: July 28, 1975

[21] Appl. No.: 599,709

[52] U.S. Cl. .......................... 340/173 R; 307/303; 357/45; 340/173 AM; 340/173 SP
[51] Int. Cl.² ....................................... G11C 17/00
[58] Field of Search ... 340/173 R, 173 SP, 173 AM; 357/45; 307/303

[56] References Cited

UNITED STATES PATENTS

| | | | |
|---|---|---|---|
| 3,475,733 | 10/1969 | Gaines et al. | 340/173 AM |
| 3,644,904 | 2/1972 | Baker | 340/173 AM |
| 3,644,906 | 2/1972 | Weinberger | 340/173 AM |
| 3,691,538 | 9/1972 | Haney et al. | 340/173 SP |
| 3,755,791 | 8/1973 | Arzubi | 340/173 R |
| 3,765,001 | 10/1973 | Beausoleil | 340/173 R |
| 3,803,562 | 4/1974 | Hunter | 340/173 R |
| 3,810,301 | 5/1974 | Cook | 340/173 R |
| 3,881,175 | 4/1975 | Wanlass | 340/173 SP |

Primary Examiner—David L. Trafton
Attorney, Agent, or Firm—Spensley, Horn, & Lubitz

[57] ABSTRACT

A system and method for interconnecting a plurality of separate memories (on other circuits) on a wafer so as to electrically exclude defective memories and include operative memories. A single discretionary connection is associated with each of the separate memories and such connection is made (or broken) after a memory is tested. In addition to a bidirectional memory bus used for input/output data and addresses, the wafer includes a separate identity bus used to define the memory organization. The identity bus is interconnected by a plurality of incrementers, one associated with each memory. The signal on the identity bus is incremented by useable memories and such signal is compared to an address on the bidirectional memory bus to select memories in an organized manner.

20 Claims, 5 Drawing Figures

WAFER SCALE INTEGRATION SYSTEM

BACKGROUND OF THE INVENTION

1. Field of the Invention

The invention relates to the field of wafer scale integration.

2. Prior Art

In the fabrication of integrated circuits such as metal-oxide-silicon (MOS) integrated circuits, a plurality of identical circuits such as memories are simultaneously fabricated on a wafer. The wafer is then broken along scribe lines into a plurality of dice or chips which are separately tested and packaged. Typically, yields from a given wafer are less than a 100 percent and many of the chips are discarded. This fabrication technique has several disadvantages. For example it is recognized in the semiconductor industry that the cost associated with the packaging of the individual chips represents a substantial portion of the total costs of the end products. Moreover, the wafer area is not economically used since substantial area is needed for scribe lines and bonding pads. Many attempts have been made in the prior art to utilize the useful or operative circuits on a wafer while bypassing the inoperative circuits without physically separating the chips. For a general discussion of this technology, see the prior art section of U.S. Pat. No. 3,641,661.

Generally, the operative circuits or devices on a wafer are electrically isolated from the inoperative devices through the use of one or more discretionary connection. For example, after a device is tested on the wafer, and is found to be operative, it is connected to a wafer bus or master circuit. Among the prior art techniques used for discretionary connections include those which utilize specially generated masks, for example, see U.S. Pat. No. 3,835,530; or fuses, fuseable links, or the like, for example see U.S. Pat. No. 3,810,301.

As will be seen, the present invention requires only a single discretionary connection for electrically connecting a circuit or device to a wafer bus even where each device comprises an entire memory system, such as a 4K bit random-access memory (RAM).

SUMMARY OF THE INVENTION

The described improvement is generally used with a semiconductor wafer having a plurality of circuit units fabricated on the wafer and a first bus for communicating with these units. A second bus is also disposed on the wafer for providing identification signals to the units. Circuit means coupled to the second bus and disposed on the wafer selectively alter the identification signals along the second bus. Thus, these circuit means may be used to provide an identification signal to each useable circuit unit.

DETAILED DESCRIPTION OF THE INVENTION

The invention in its presently preferred embodiment utilizes a plurality of identical memories or memory modules, each comprising a 4K(4K×1) random-access memory (RAM) disposed on a silicon wafer. The memories are fabricated in accordance with known MOS technology and may employ n-channel or p-channel devices, metal gate or polycrystalline silicon gates or other known variations or with known bipolar technology. The wafer scale integration system and circuit, in its presently preferred embodiment, couples the plurality of 4K memories to form a 64K by 16 wafer scale RAM, hence the presently invented system and circuit is also disposed on the same wafer. Each of the memory modules includes an entire memory (memory module), that is, it includes input and output buffers, decoders, and other peripheral circuits. As presently preferred static memories are employed, although dynamic memories may be utilized. In the event that dynamic memories are employed a common refresh synchronization line may be deployed on the wafer for simultaneous refreshing. In the presently preferred and described embodiment a bidirection bus is utilized, which includes 16 lines. This bus transmits the address information, input data and receives the output data. For this reason each memory module includes address latches.

Figure 1:
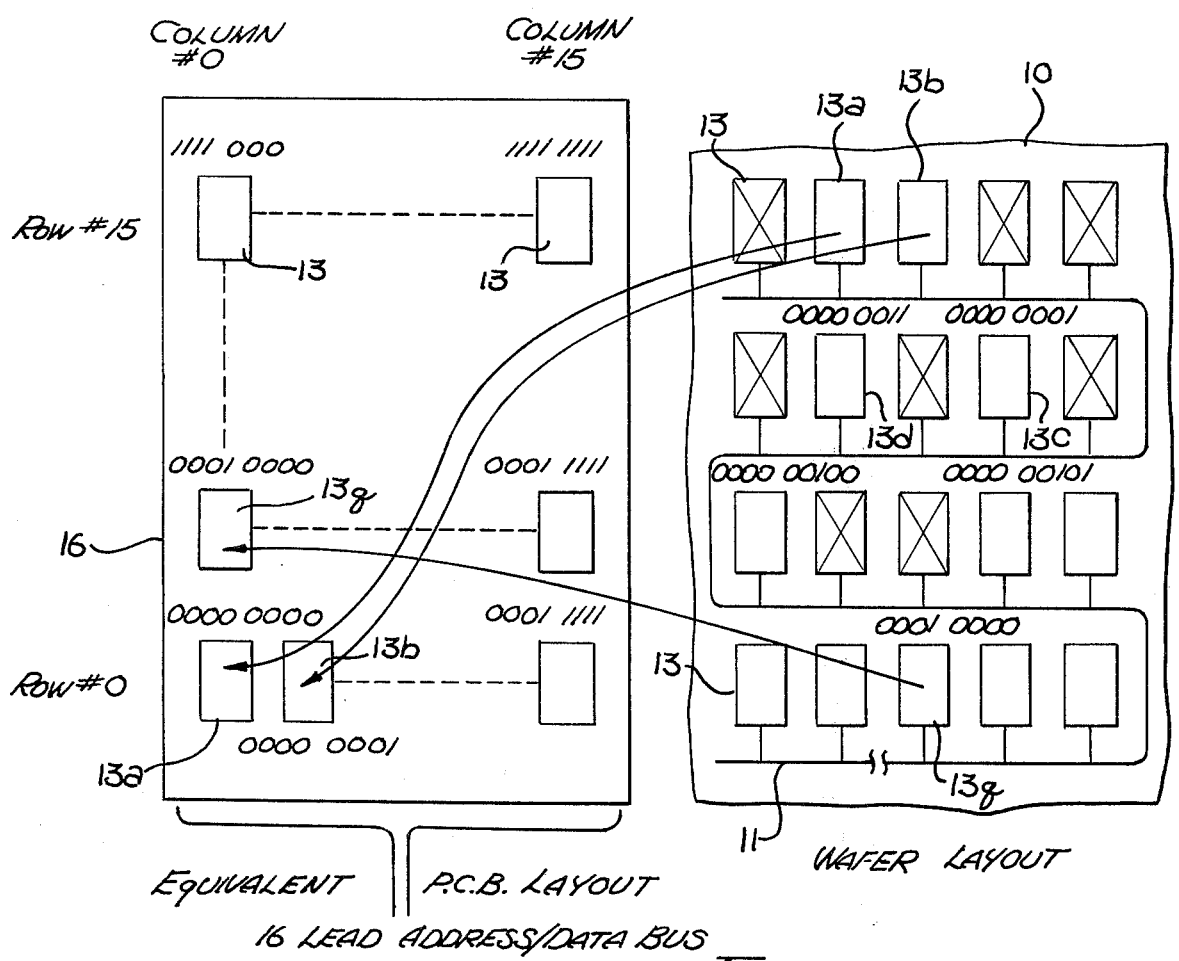
FIG. 1 is a diagram illustrating the positions of useful devices on a wafer to an equivalent printed circuit board. This diagram is used to illustrate the ordering or organization of useful devices on a wafer performed by the presently disclosed invention.

In order to better understand the present invention, and in particular the method by which the identity bus orders the useful or operative memory modules on the wafer, a partial wafer will be described in conjunction with FIG. 1 in equivalent printed circuit board form. Referring first to a partial wafer 10, the wafer includes a plurality of memory modules 13. Each of which comprise an entire memory such as a 4K RAM. All the memory modules 13 are coupled to a common address-/data bus 11. Assume once the memory modules 13 have been fabricated on the wafer 10 along with the bus, each of the modules is tested to determine if it is an operable memory. In FIG. 1, those memory modules which are assumed inoperable, for sake of discussion, include an X within the memory modules. Thus, memory modules 13a, 13b, 13c, 13d and 13q are operable memories.

Now referring to the printed circuit board 16, assume that this board includes 256 memory modules 13 organized in 16 rows and 16 columns. 16 leads are coupled to the board 16, these leads are used both for providing an address to the memory system and as a bidirectional data bus. Each memory on board 16 is identified with an eight bit digital number, the first four bits are used to identify the row and the last four bits are used to identify the column. Thus, the memory bearing the digital number 0000 0000 is in the position of row 0, column 0; while the memory identified as 1111 1111 is in the position of row 15, column 15. As will be described in more detail, the first useable or operative memory module of wafer 10, module 13a is equivalent to the memory module located at row 0, column 0 of board 16. The next operable memory module of wafer 10, module 13b is in the position of row 0, column 1. The 17th useable memory module, module 13q is shown on board 16 at row 1, column 0, and is also identified as position 0001 0000. The other memory modules of board 16 are identified in a like manner as is partially shown in FIG. 1.

As will be seen an identity bus is used on the wafer which for the described embodiment includes eight leads. Four of the leads are used to transmit a data bus position which corresponds to a column position, while the other four leads of the identity bus are used to transmit an address range which corresponds to a row position as shown on board 16.

Figure 2:
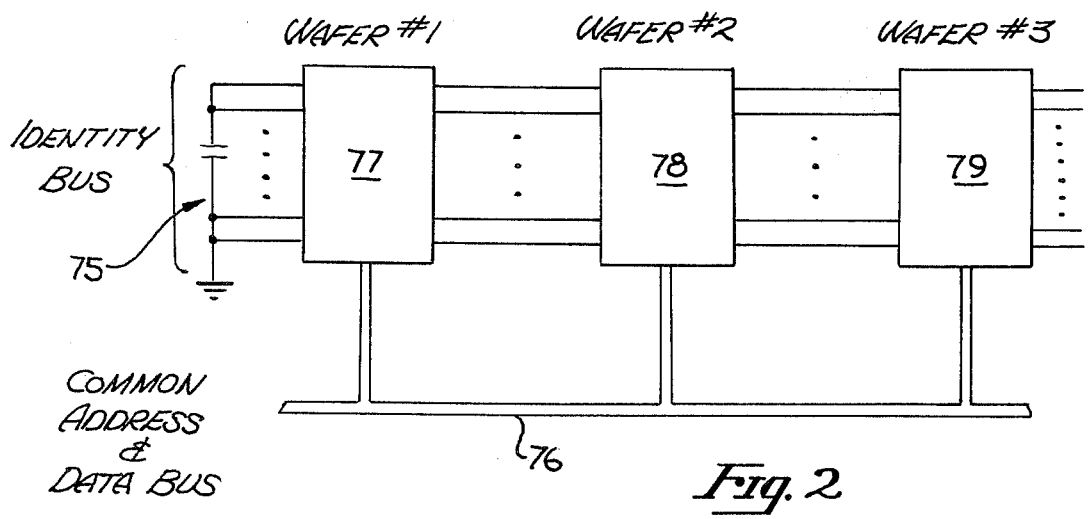
FIG. 2 is a block diagram illustrating interconnections between a plurality of wafers which may be used in the present invention.
Figure 3:
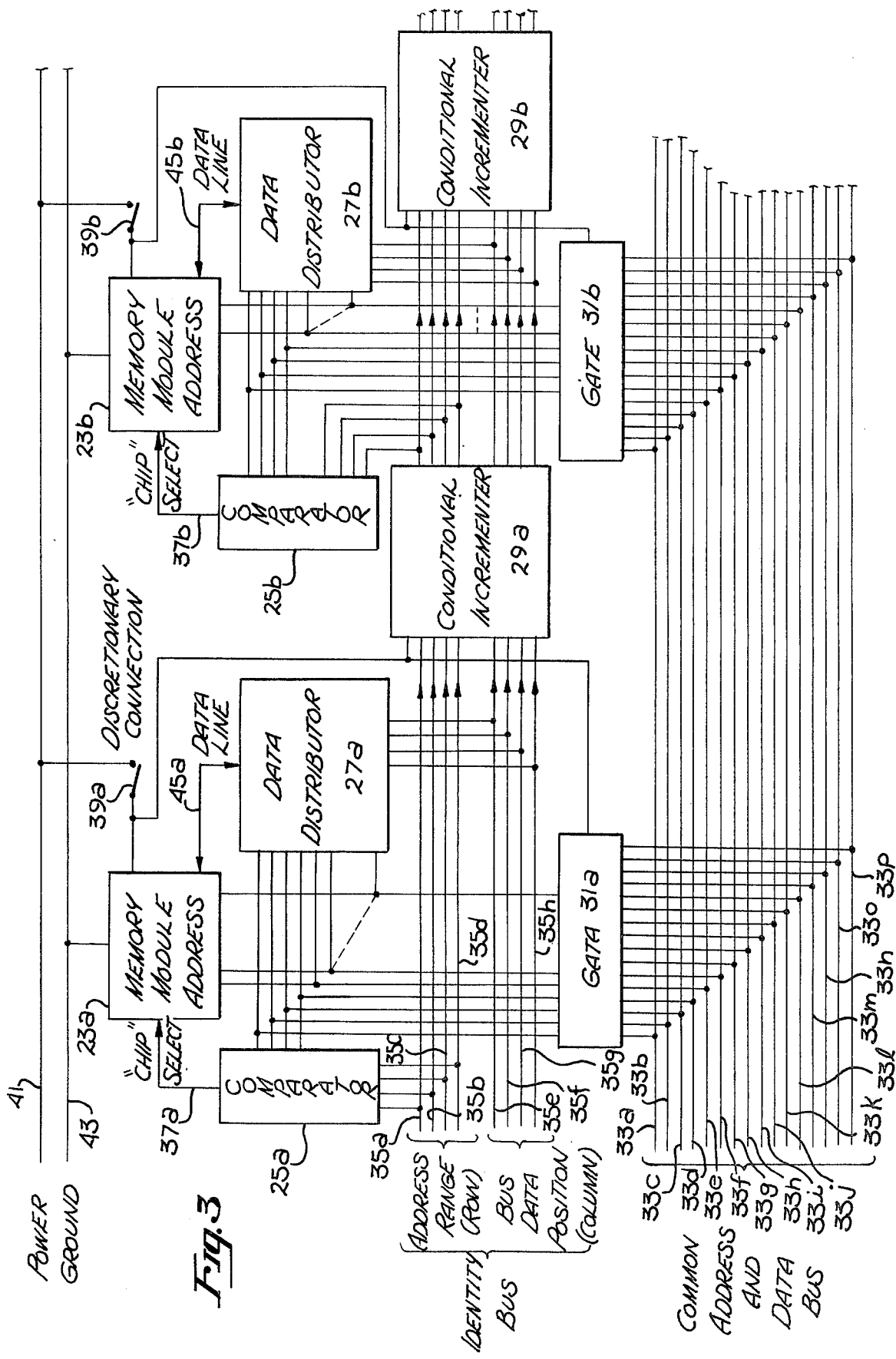
FIG. 3 is a partial block diagram of a wafer fabricated in accordance with the present invention illustrating memories on the wafer interconnected with a common address and data bus and an identity bus.

Referring now to FIG. 3, two memory modules such as modules 13 of FIG. 1 are shown as memory modules 23a and 23b, coupled to a common address and data bus 33a through 33p and an identity bus 35a through 35h. The memory modules 23a and 23b along with all the circuitry and busses shown in FIG. 3 are fabricated simultaneously on the single wafer. Several hundred memory modules 23 for the presently preferred embodiment are simultaneously fabricated to assure that 256 operative memories are produced, however any number of operative memories may be used with the present invention (this aspect of the invention shall be discussed in conjunction with FIG. 2).

The wafer upon which the memory modules 23a and 23b are fabricated include a common power line 41 which is coupled to each of the memory modules, gates 31a and 31b and conditional incrementers 29a and 29b through a discretionary connection, shown as discretionary connections 39a and 39b, respectively. (Other power connections to the comparators 25a and 25b and data distributors 27a and 27b are made from corresponding memory module and are not shown in FIG. 3). In the presently preferred embodiment these discretionary connections are fabricated "open" and are closed after each memory modules is checked, such that the operable memory modules are permanently coupled to the power line 41. Any one of numerous known discretionary connection means may be utilized such as fuseable links, laser formed connections, mask defined connections, bonded connections, or connections made with programmable devices such as floating gate devices charged through avalanche injection, tunneling or other phenomena. Each memory is also permanently coupled to a ground line 43 as shown in FIG. 3.

Associated with each memory module is identification logic and a gate; for memory module 23a this includes comparator 25a, data distributor 27a, and incrementer 29a and gate 31a. The comparator 25a and data distributor 27a are coupled to the eight leads of the identity bus, leads 35a through 35h. The incrementers 29 are disposed along the identity bus, one incrementer being fabricted for each memory module. The distributor and comparator for a given module are coupled to the identity bus such that they sense the output of the preceeding incrementer. That is, comparator 25b and data distributor 27b are coupled to the identity bus at the output of conditional incrementer 29a; the comparator and data distributor associated with the memory module following module 39b (not shown) would be coupled to the identity bus at the output of the conditional incrementer 29b.

Each comparator 25 includes means for comparing two four bit digital signals, and means for providing an output signal when the two four bit digital signals are identical. Specifically comparator 25a compares the signal on lead 35a through 35c with the signals on lead 33a through 33d (after the latter signals have passed through gate 31a) and provides an output signal on the chip select line 37a when the two digital signals are identical. The chip select signal on line 37a when applied to the memory module 23a indicates that the module 23a has been selected by the address applied to bus 33. Likewise, a signal on line 37b from comparator 27b indicates that memory module 37b has been selected. Commonly known circuits may be utilized for the comparator 25.

Data distributer 27a is a multiplexing means for coupling the data line 45a to one of the common address data bus lines 30a through 33p (through gate 33a) in accordance with the data distribution signal on the data bus position lines 35e through 35h of the identity bus. In effect, distributor 27a is a switch which couples the data flowing into, or form, memory module 23a to one of the 16 address and data bus lines 33a through 33p. Thus, the data distributor 27a may be any one of numerous multiplexing means known in the art. Similarly, the data distributor 27b directs the data flowing into, or from, the memory module 23b on line 45b to one of the 16 address and data bus lines. Each distributor 27 on the wafer performs the same function, and is thus coupled to its respective memory module, bus 33 and line 35e through 35h of the identity bus 35.

Each conditional incrementer, such as incrementer 29a, receives an eight bit digital signal, and selectively provides an output signal which is equal to the input signal plus a binary one. Thus, if the signal 0000 0000 is applied to the input of conditional incremeter 29a, and if this incrementer receives power from line 41 through the discretionary connection 39a, the output from incrementer 29 will be 0000 0001. However, while not shown, other permanent power connections may be required for the incrementers to assure proper operation of the incremented for non-incrementing functions. One end of the identity bus 35 is coupled to ground, and thus if 256 conditional incrementers are activated from line 41, the output from the last such incrementer will be the signal 1111 1111. However, a conditional incrementer only increments if it receives power from line 41. If, by way of example, discretionary connection 39b has been made, conditional incrementer 29b will increment. On the other hand, if this incrementer does not receive power from the power bus line 41, the signal applied to the input of the incrementer passes through the incrementer unaffected. Thus, if connection 39a has not been made and connections 39b have been made, and if the input to conditional incrementer 29a is 0000 1111, the output of conditional incrementer 29a will be 0000 1111, while the output of conditional incrementer 29b will be 0001 0000.

A plurality of conditional incrementers are disposed along the identity bus, one associated with each memory module. Any one of a plurality of known incrementing circuits may be utilized for the conditional incrementers. Since the incrementers only increment each time the memory system receives power (when the system is first turned on), these circuits may be slow acting, low power consuming circuits.

Each gate 31 is used for coupling the common address and data bus line with the memory module, comparator and data distributer, however only if the discretionary connection associated with that memory module has been made. Each gate 31 comprises a plurality of ordinary transmission gates or AND gates. Referring to gate 31a, this gate couples the common address and data bus 33 with the comparator 25a, data distributor 27b and memory module 23a if the discretionary connection 39a has been made. More specifically, gate 31a couples lines 33a, 33b, 33c and 33d to the comparator 25a and data distributor 27a. The remaining 12 lines of the common address and data bus lines 33e through 33p, are coupled through gate 31a to the data distributor 27a and to the memory module 23a. The address signals applied to lines 33a through 33m are used for selecting a group of memory modules and a location within these related memory modules.

Assume that the memory system partially shown in FIG. 3 has been fabricated on a wafer, and that the memory system includes several hundred memory modules coupled as shown in FIG. 3. After the fabrication of the memories, each memory is individual tested to determine if it is operable. Probes commonly used in the art may be used for this purpose. If a memory is operable, then the discretionary connection associated with that memory is made. (In some applications it may be desirable to fabricate the system with all the discretionary connections made, and then open connection for inoperable memories). Assume for the sake of discussion that memories 23a and 23b are operative and that discretionary connections 39a and 39b have been made. Further assume that memory module 23a is the first operative memory on the wafer, that is, the one corresponding to memory module 13a of FIG. 1. As previously mentioned one end of the identity bus is coupled to ground, thus the state of line 35a through 35h, for the assumed conditions will be 0000 0000 at the input of conditional incrementer 29a. The output of conditional incrementer 29a will be 0000 0001, and the output of conditional incrementer 29b will be 0000 0010. Thus, memory module 23a corresponds to memory module 13a of FIG. 1, while memory module 23b corresponds to memory module 13b of FIG. 1.

When the memory is activated by the application of power to line 41, the signals on the identity bus are set by the incrementers; the identity information ripples along the identity bus and is incremented as it passes through activated incrementers. The output of the 255the activated incrementer will be 1111 1111, and the memory module receiving this signal will correspond to the memory module shown in FIG. 1 in row 15, column 15. The outputs of each incrementer remains fixed during the memory system operation, however each time the memory system is turned-on, by application of power to line 41, the identity bus will again set itself.

It will, of course, be apparent that while the individual memory modules, comparators and data distributors and to some extent, the gates, may have less than perfect yields, the presently discussed embodiment assumes that the identity bus and incrementers, and the common address and data bus are operative. However, since bus lines typically have a high yield, and since the incrementers are relatively simple circuits the yield loss due to these components is acceptable. In fact, this yield loss may not be any greater than yield loss associated with dicing a wafer.

Assume that the address 0000 0000 is applied to the memory on the common address and bus lines 33a through 33p. The signals on lines 33a through 33d (0000) after passing through gate 31a is compared within comparator 25a with the signals on lines 35a through 35d which is 0000. The result of this comparison causes an output signal to occur on line 37a, which in turn, activates memory 23a. Since the output of conditional incrementer 29 is 0000 0001 memory module 39b will likewise be selected, that is, a signal will occur on line 37b. In fact, the first 16 operative memory modules will be selected for the address 0000 0000. The zero's on lines 33e through 33p after passing through the gates, such as gate 31a, each select a particular location within the selected memory modules. Each selected location is coupled to a different line of the common address and data bus by the data distributors. Specifically data distributor 27a receives the signal 0000, while data distributor 27b receives the signal 0001, and hence each of these distributors couples the selected memory module locations to a different line of the address and data bus. Likewise, the data distributor of the remaining 14 selected memory modules directs data onto, or from, a different data line. This address (0000 0000) corresponds to a selection of column 0 of the board 16 of FIG. 1.

It is thus apparent that if only 16 memory modules are operative on a given wafer for the described embodiment, a 4K × 16 memory will be obtained. If another 16 memory modules are operative on a given wafer, an 8K × 16 memory will be functional and if 256 memory modules are operative, a 64K × 16 will be realized. In a similar manner the address 0001 0000 (or any other address) would couple a different group of 16 memory module locations (each in different modules) to different lines of bus 33.

In some cases more than the desired number of memory modules may be operative on a given wafer. These modules may be used to "replace" other modules that fail. To replace a module, the discretionary connection to the failed module would be opened, and the connection to an unused module completed. When power is again applied to line 41 the incrementers would (automatically) reorganize the memory.

In some instances, fewer than required operable memory modules may not be found on a single wafer, and it may be desirable to couple wafers in order to take maximum advantage of useable modules on each wafer. By way of example, if 16 bit words are used, and if a given wafer has 63 useable modules, 15 modules will remain unused (unless shorter word lengths are utilized). In FIG. 2, three wafers, wafers 77, 78, and 79 are shown coupled in series to a common identity bus 75 and in parallel to a common address and data bus 76. The identity busses of the individual wafers, since they are connected in series, act as a single bus. Thus, if the output of the last activated incrementer on wafer 77 is 0010 1000, the output of the first activated incremented on wafer 78 will be 0010 1001. This permits any size memory to be built even though the yield from a given wafer or group of wafers is low.

It is apparent that with the memory system arrangement shown in FIG. 3 all the lines associated with the identity bus and common address and data bus (at least from the input to the wafer to the last useable memory module on the wafer) must themselves be useable for the wafer scale memory system to operate. While the fabrication of such lines and the associated incrementers, in the case of the identity bus, have had a high yield, nevertheless the requirement that all these lines be operative may result in unacceptable yield losses for some large arrays. By utilizing a hierarchy of bus lines, each of which is associated with a different group of memory modules, the yield loss associated with the buses and incrementers can be reduced. A theoretical analysis shows that between two-to-three (actually the number $e$) memory modules per branch bus line is the most optimum ratio of memory modules to bus lines; however, in the presently preferred embodiment, and primarily because of topographical considerations, four memory modules per branch bus have been selected.

Figure 4:
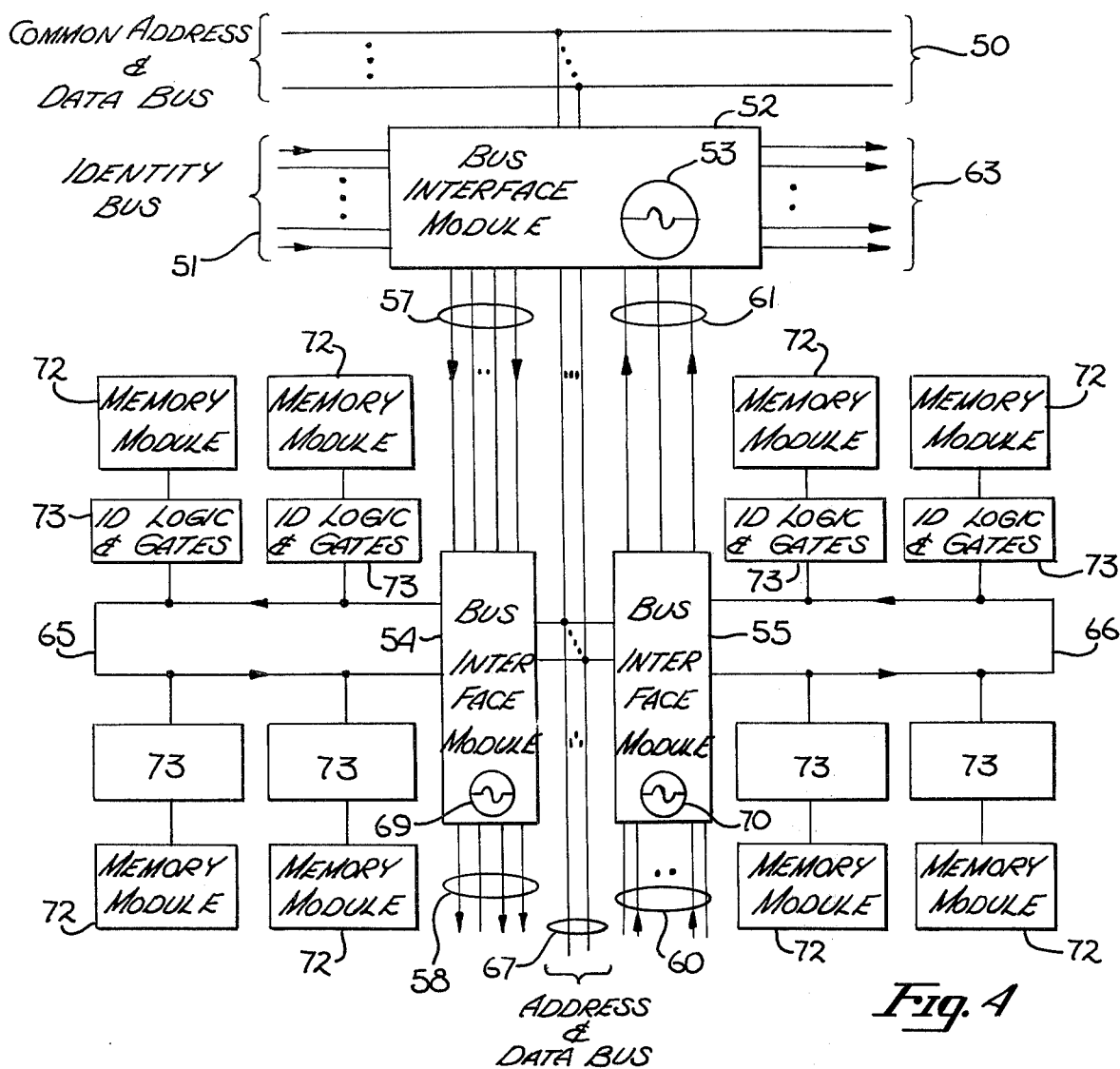
FIG. 4 is a partial block diagram of a wafer built in accordance with the present invention illustrating a heirarchical bus structure.

In FIG. 4 a main common address and data bus 50 and a main identity bus section 51 are shown, with the identity bus section 51 being coupled to the input of a bus interface module 52. The main address and data bus 50 is coupled in a parallel arrangement with the module 52 while the main identity bus sections are coupled in a series arrangement. In the presently preferred embodiment the main busses are fabricated at the central portion of a wafer where the yields are typically higher. The bus interface module 52 includes a plurality of gates for connecting (discretionary connection) the address and data bus 50 with the secondary address and data bus 67 and the identity bus 51 to a secondary identity bus 57. Both secondary buses include the same number of leads as its respective primary bus. In module 52 the discretionary connections between busses is made by a single link 53 which supplies power to all the gates within module 52. Other types of known discretionary connection means may be utilized for module 52. If the discretionary connection within module 52 is not made, the identity bus section 51 passes through module 52 and becomes common with bus section 63, whereas if the discretionary connection is made identity bus 51 is coupled in series with bus 57 and bus section 61 is coupled in series with secondary bus sections 63.

The bus interface module 54 may be identical to module 52 and again includes a discretionary connection, link 69, which allows the secondary busses 57 and 67 to be coupled to branch busses. In FIG. 4 a single bus line (bus 65) is shown for both the branch identity bus and branch address and data bus; however, these busses each include the same number of separate lines at their respective secondary and main bus.

If the connection of link 69 is made those lines in the branch bus 65 used for carrying the identity bus information are coupled in series with corresponding lines of the secondary identity busses 57 and 58 and those lines of the branch bus 65 used for carrying the address and data bus information are connected in parallel to the secondary bus 67. Again, as was the case with the module 52, if the discretionary connection of module 54 is not made bus 57 remains coupled to secondary bus 58.

As previously mentioned, in the present preferred embodiment, four memory modules are connected to each of the branch busses such as shown in FIG. 3 for branch busses 65 and 66. Each of the memory modules 72 may be similar or identical to the memory modules 23a and 23b shown in FIG. 3, and each includes a discretionary connection which allows power to be applied to the modules, if the modules are operative. Associated with each memory module 72 is identification logic and gates 73 which correspond to the comparator 25a, the distributor 27a, and gate 31a associated with the module 23a of FIG. 3. Each memory module 72 and the associated identification logic and gates 73 are coupled to its respective branch bus in the same manner that memory module 23a, comparator 25a, data distributor 27a and gate 31a are coupled to the address and data bus 33, and identity bus 35 of FIG. 3. Moreover, those lines of each of the branch busses, such as branch bus 65 which comprise the identity bus lines include conditional incrementers disposed along the branch identity bus lines in the same manner that the conditional incrementer 29a and 29b are disposed along the identity bus of FIG. 3.

In the presently preferred arrangement, two additional identification bus interface modules are coupled between secondary busses 58 and 60, each of which allow a discretionary connection to be made to a branch bus, and where each branch bus includes four memory modules arranged in the same manner as the memory modules associated with the branch busses 65 and 66.

Any desired number of secondary busses may be disposed along the main bus. In some applications higher order (or lower order) busses may be useful. In the presently preferred embodiment all the busses, memory modules and related circuitry are fabricated on a single wafer.

Assuming that the circuit shown in FIG. 4 has been fabricated, and furthermore, that a plurality of modules similar to modules 52 have been fabricated along the main address and data bus 50, and in series with the identity bus; first a test is made to determine if the secondary busses are operative. For example, the secondary identity busses 57, 58, 60 and 61, and address and data bus 67 are examined to determine if they are operative. If they are operative then the discretionary connection within module 52 is made making these secondary busses 67 part of the main busses. Following this, each of the branch busses such as branch 65 are examined to determine if they are operative For example, if branch bus 65 is functioning, discretionary connections 69 may be made making the branch bus 65 part of the main bus system of the memory. On the other hand if the branch bus 66 is defective, discretionary connection 70 is not made, thus the branch bus 66 remains isolated from the remainder of the busses on the wafer.

Following an examination (or testing) of the busses, those memory modules which are operative are coupled to their respective operable branch busses, in the manner described in conjunction with FIG. 3. In practice, it may be desirable to first test the memory modules associated with a given branch bus, and if none of the modules (or few of the modules) are operative, the branch bus may not be coupled to the secondary bus even though the branch bus itself is operative. This will prevent unnecessary loading on the bus lines.

Figure 5:
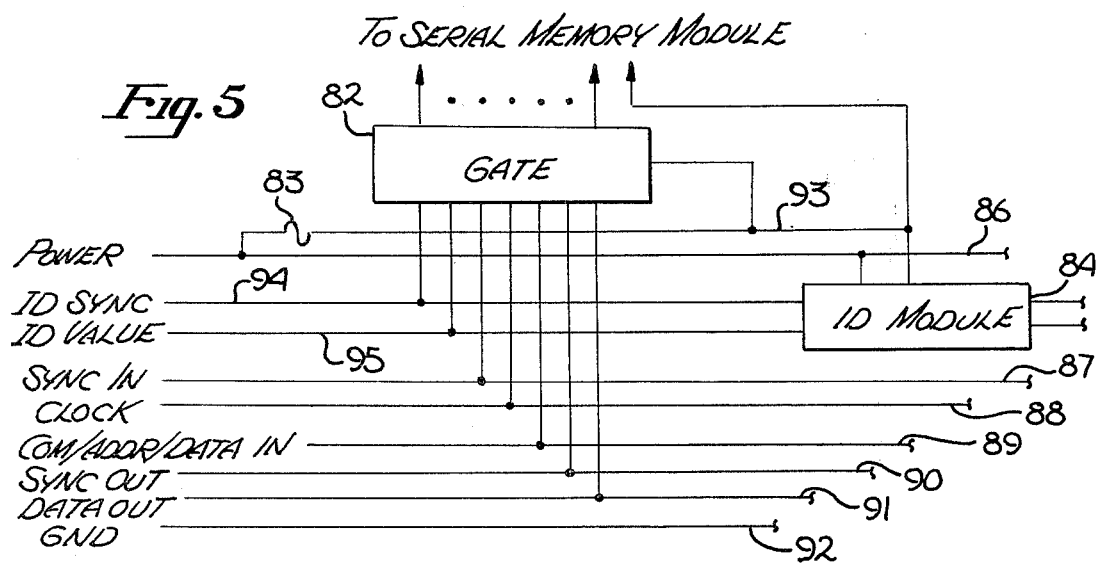
FIG. 5 is a partial block diagram of an alternate embodiment of the present invention employing a serial data bus.

Referring to FIG. 5 an alternate embodiment of the present invention is illustrated which employs serial memory modules each adaptable for receiving and transmitting information in serial form. These memory modules are not illustrated; however, they are coupled to the gate 82 in the same manner as above described for FIG. 3. In FIG. 5, a plurality of lines for this embodiment are shown such as a power line 86, an identification synchronization line 94, an identification value line 95, a synchronization-in line 87, a clock line 88, a line for commands, addresses and data (line 89), a synchronization-out line 90, a data out line 91, and a ground line 92. These lines are used in place of the identity bus and common address and data bus of the embodiment shown in FIG. 3.

A gate 82 which may be similar to gate 31a and 31b of FIG. 3 is utilized for selectively passing signals to the memory module from lines 87, 88, 89, 90, 91, 94 and 95. An identification module 84 which is used to increment the identification value signal on line 95 along with gate 82 receive power on line 93 through a discretionary connection 83. Line 93 is also coupled to the memory module and is used for applying power to the memory. This line may also be used to supply power to the comparator used in conjunction with each memory module. Not shown in FIG. 5, however utilized with this embodiment, are comparators which may be similar in construction and opearation to known comparators. These comparators form the same function as comparator 25a and 25b; however, they are adaptable for receiving and comparing serial signals. Note that since only a single data line is used in this embodiment data distribution is not necessary.

In this embodiment the identity value is transmitted on line 95, in serial form, and such transmission is synchronized by timing signals on the I.D. sync line 94. If the discretionary connection, such as connection 83, has been made then the identification module 84 increments (by a binary one) the identification value transmitted on line 95. Thus, this embodiment operates in a substantially a similar manner to the previously discussed embodiment. This embodiment has the apparent advantage of requiring fewer bus lines.

The remaining lines shown in FIG. 5 such as lines 87 through 91 are utilized in the operation of the memory. Line 87 is used to indicate to the memory modules that data will follow on the command/address/data-in line 89. The sync-out line 90 is used by the selected memory module to signal that information will be read from that module.

The serial embodiment operates in a similar manner to the embodiment of FIG. 3. First, the memory modules are tested to determine if they are operable. If a particular module is operable the discretionary connection, such as connection 83 is made. The identity module 84 then will increment by a binary one the identity value transmitted to its input. If the discretionary connection 83 was not made the identity value transmitted to the input of the module 84 would be passed by the module as received, that is, it is not incremented. As was the case with the embodiment of FIG. 3, any number of memory modules may be fabricated on a wafer along with the bus lines and incrementing identification modules. Also for this serial embodiment separate wafers may be combined as shown in FIG. 2, and a hierarchy of bus lines may be employed.

A wafer scale memory system has thus been disclosed which enables the useful memories on the wafer to be connected to a common address and data line with only a single discretionary connection being made for each memory module. The memory system automatically organizes itself in a uniform manner insofar as a user of the memory system is concerned. The disclosed identity bus may be utilized either in a parallel or serial form, and may be continued from one wafer to the next. While the presently preferred embodiment has been disclosed in conjunction with a memory system, it will be apparent that the identity bus, with the conditional incrementers may be used for other wafer scale integration.

I claim:

1. In a semiconductor wafer which includes a plurality of circuit units fabricated on said wafer and a first bus for communicating with said devices an improvement comprising:
   a second bus disposed on said wafer for transmitting an identification signal to said units;
   circuit means disposed on said wafer and coupled to said second bus for selectively altering said identification signal along said second bus;
   whereby said circuit means may provide an identification signal to each useable circuit unit on said wafer.

2. The improvement defined by claim 1 wherein said circuit means comprises means for incrementing a signal.

3. The improvement defined by claim 2 wherein said circuit means comprises means for receiving a serial coded digital signal and for incrementing said signal.

4. The imrovement defined by claim 2 wherein said circuit means comprises means for receiving a digital signal transmitted in parallel form and for incrementing said signal.

5. The improvement defined by claim 2 including a plurality of comparator means each for comparing a signal on said first bus with a signal on said second bus, said comparator means being coupled to said first bus and said second bus.

6. The improvement defined by claim 5 including a plurality of discretionary connection means for providing selective coupling with said circuit means.

7. The improvement defined by claim 6 wherein said plurality of circuit units comprises a plurality of memories.

8. The improvement defined by claim 7 including a plurality of multiplexing means each for sensing a signal on said second bus and for directing information from one of said memories to lines of said first bus.

9. A circuit for electrically organizing a plurality of circuit units a semiconductor substrate where some of said units are useable and others are not useable comprising:
   a plurality of incrementing means for either incrementing a signal or transmitting a signal unaltered said incrementing means being disposed on said substrate, and
   a bus means disposed on said substrate for interconnecting said incrementing means,
   whereby said signal on said bus may be incremented for useable circuit unit thereby providing a source of an identification signal.

10. The circuit defined by claim 9 including a plurality of comparator means for comparing signals on said bus with address signals.

11. The circuit defined by claim 10 including a plurality of discretionary connections for providing electrical paths to at least said incrementing means.

12. The circuit defined by claim 11 wherein said circuit units each comprise a memory.

13. The circuit defined by claim 12 including multiplexing means for distributing data said multiplexing means being coupled to said bus.

14. A circuit for organizing a plurality of memories on a semiconductor wafer where some of said memories are operable and others inoperable comprising:
   an address and data bus disposed on said wafer,
   a plurality of gates for selectively coupling said address and data bus to said memories, said gates being disposed on said wafer, an identity bus disposed on said wafer, said bus including a plurality of incrementing means disposed along said identity bus, a plurality of comparator means each for comparing signals on said identity bus with signals on said address and data bus and for providing a signal to one of said memories, each said comparator means being coupled to said identity bus, and said address and data bus to a different one of said memories, a plurality of data distribution means, each being coupled to said identity bus, said address and data bus and to a different one of said memories, said distribution means for sensing a signal on said identity bus and for directing data to said address and data bus as a function of said sensed signals, whereby incremented signals along said identity bus provides unique information to each useable memory thereby organizing the useable memories in a memory system.

15. The circuit defined by claim 14 including a plurality of discretionary connections for coupling power to selected incrementing means and gates.

16. The circuit defined by claim 15 wherein said discretionary connections also couples power to operable memories.

17. The circuit defined by claim 14 wherein at least one of said address and data bus, and identity bus includes a main bus and a secondary bus and a discretionary connection for coupling said main bus to said secondary bus.

18. The circuit defined by claim 17 wherein said secondary bus is coupled by a discretionary connection to a plurality of branch busses and wherein said memories are coupled to said branch busses.

19. A semiconductor wafer integration circuit disposed on a wafer with a plurality of other circuit units comprising:

a main bus, at least one second bus, discretionary bus connection means coupled to said main bus and said second bus for selectively permitting coupling of said main bus and said second bus; and incrementing means disposed along said second bus for selectively incrementing signals along said second bus, whereby identification information may be developed on said wafer as a function of operable circuit units and where operable busses may be selected for use with operable units.

20. The circuit defined by claim 19 including at least a third bus interconnecting said main bus and said second bus and including discretionary bus connection means for providing a selective coupling between said second bus and said third bus.

* * * * *